(12) United States Patent
Koo et al.

(10) Patent No.: US 8,077,000 B2
(45) Date of Patent: Dec. 13, 2011

(54) ELECTROMAGNETIC BANDGAP STRUCTURE AND PRINTED CIRCUIT BOARD

(75) Inventors: Ja-Bu Koo, Suwon-si (KR); Mi-Ja Han, Jeonju-si (KR); Han Kim, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 626 days.

(21) Appl. No.: 12/232,463

(22) Filed: Sep. 17, 2008

(65) Prior Publication Data
US 2009/0184782 A1    Jul. 23, 2009

(30) Foreign Application Priority Data

Jan. 21, 2008  (KR) .................. 10-2008-0006380
Jun. 18, 2008  (KR) .................. 10-2008-0057444

(51) Int. Cl.
*H01P 1/201*    (2006.01)
(52) U.S. Cl. ....................................... 333/202; 333/246

(58) Field of Classification Search .......... 333/202–205, 333/236, 238, 245–247
See application file for complete search history.

(56) References Cited

U.S. PATENT DOCUMENTS

| 6,002,593 | A | 12/1999 | Tohya et al. |
| 7,123,118 | B2 * | 10/2006 | McKinzie, III ............... 333/219 |

FOREIGN PATENT DOCUMENTS

| CN | 1201363 A | 12/1998 |
| JP | 6-181389 | 6/1994 |

OTHER PUBLICATIONS

Chinese Office Action mailed Jul. 14, 2011 in corresponding Chinese Patent Application 200810171136.3.
Japanese Office Action dated Aug. 2, 2011 in corresponding Japanese Patent Application 2008-250877.

* cited by examiner

*Primary Examiner* — Benny Lee
*Assistant Examiner* — Gerald Stevens

(57) ABSTRACT

Disclosed are an electromagnetic bandgap structure and a printed circuit board. In accordance with an embodiment of the present invention, the electromagnetic bandgap structure can include a dielectric layer; a plurality of conductive plates; a stitching via, configured to pass through the dielectric layer and have a part electrically connecting the conductive plates to each other by connecting through a planar surface that is different from a planar surface of the conductive plates, and a through via. Here, the dielectric layer, the conductive plates and the stitching via can be placed between any two conductive layers, and the through via can be configured to pass through a clearance hole formed in the conductive layer and electrically connect the two conductive layers to each other.

15 Claims, 14 Drawing Sheets

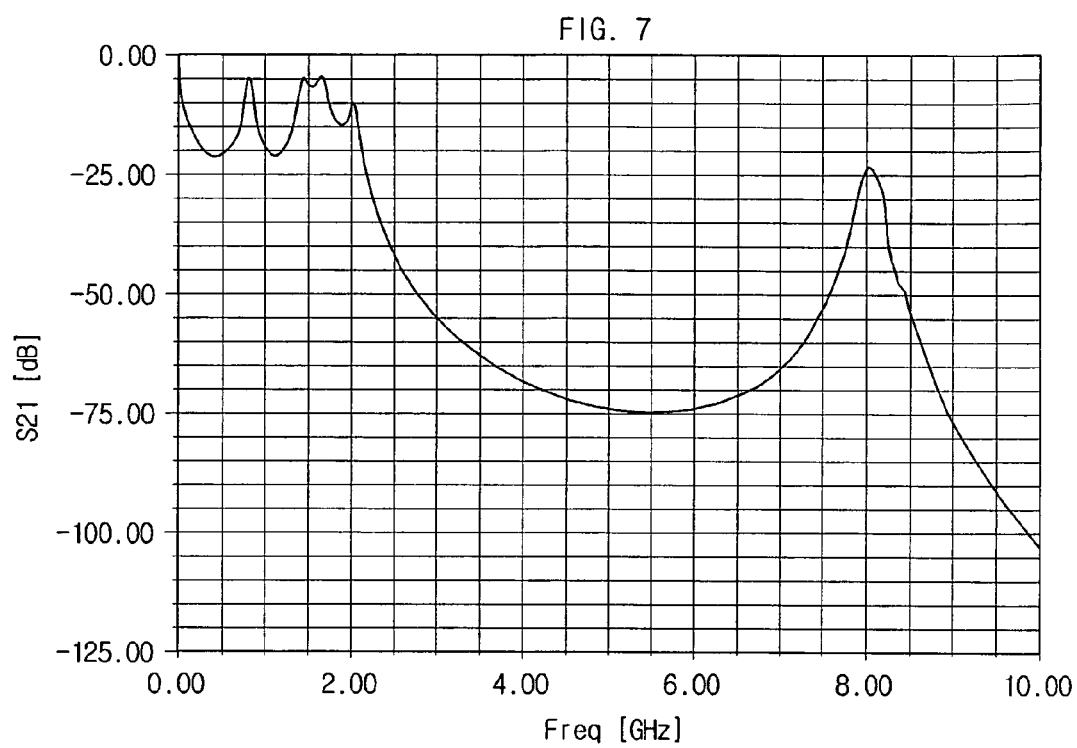

ELECTROMAGNETIC BANDGAP STRUCTURE AND PRINTED CIRCUIT BOARD

CROSS-REFERENCE TO RELATED PATENT APPLICATIONS

This application claims the benefit of Korean Patent Application Nos. 10-2008-0006380 and 10-2008-0057444, filed on Jan. 1, 2008 and Jun. 18, 2008, in the Korean Intellectual Property Office, the disclosure of which is incorporated herein in its entirety by reference.

BACKGROUND OF THE INVENTION

1. Field of the Invention

The present invention relates to an electromagnetic bandgap structure, more specifically to an electromagnetic bandgap structure and a printed circuit board having the same that prevent a signal ranging a predetermined frequency band from being transmitted.

2. Background Art

New electronic apparatuses and communication apparatuses are increasingly becoming smaller, thinner and lighter, reflecting today's emphasis on growing mobility.

These electronic and communication apparatuses have various complex electronic circuits (i.e. analog circuits and digital circuits) for performing their functions and operations. These electronic circuits typically carry out their functions by being implemented in a printed circuit board (PCB). The electronic circuits on the PCB commonly have different operation frequencies from one another.

The printed circuit board in which various electronic circuit boards are implemented often has a noise (i.e. mixed signal) problem, caused by the transfer and interference of an electromagnetic (EM) wave resulted from the operation frequency and its corresponding harmonics components of one electronic circuit to another electronic circuit. The transferred noise can be roughly classified into radiation noise and conduction noise.

The radiation noise can be easily prevented by covering a protective cap on the electronic circuit. However, preventing the conduction noise (refer to the reference numeral 150 of FIG. 1) is not as easy, because the conduction noise is transferred through a signal transfer path inside the board.

The noise problem will be described in more detail with reference to FIG. 1. FIG. 1 is a sectional view showing a printed circuit board including two electronic circuits having different operation frequencies. Although FIG. 1 shows a 4-layered printed circuit board 100, it shall be obvious that the printed circuit board can be modified to have a 2, 6 or 8-layered structure.

As shown in FIG. 1, the printed circuit board 100 includes metal layers 110-1, 110-2, 110-3 and 110-4 (hereinafter, collectively referred to as 110) and dielectric layers 120-1, 120-2 and 120-3 (hereinafter, collectively referred to as 120) interposed between metal layers 110. The top metal layer 110-1 of the printed circuit board 100 is implemented with two electronic circuits 130 and 140 having different operation frequencies (hereinafter, referred to as a first electronic circuit 130 and a second electronic circuit 140, respectively). In a mobile communication apparatus, for example, such as a mobile phone, the two electronic circuits 130 and 140 having different operation frequencies can be a digital circuit, acting as a micro processor, and an RF circuit (i.e. analog circuit), for receiving and transmitting an RF signal, respectively.

Here, if it is assumed that the metal layer represented by the reference numeral 110-2 is a ground layer and the metal layer represented by the reference numeral 110-3 is a power layer, each ground pin of the first electronic circuit 130 and the second electronic circuit 140 is electrically connected to the metal layer represented by the reference numeral 110-2 and each power pin is electrically connected to the metal layer represented by the reference numeral 110-3. In the printed circuit board 100, every ground layer is also electrically connected to each other through vias. Similarly, every power layer is also electrically connected to each other through vias (refer to the reference numeral 160 of FIG. 1).

If the first electronic circuit 130 and the second electronic circuit 140 have different operation frequencies, a conductive noise 150 caused by an operation frequency of the first electronic circuit 130 and its harmonics components is transferred to the second electronic circuit 140. This has a disadvantageous effect on the accurate function/operation of the second electronic circuit 140.

With the growing complexity of electronic apparatuses and higher operation frequencies of digital circuits, it is increasingly more difficult to solve this conduction noise problem. Especially, the typical bypass capacitor method or decoupling capacitor method for solving the conductive noise problem is no longer adequate, as the electronic apparatuses use a higher frequency band.

Moreover, the aforementioned solutions are not adequate when several active devices and passive devices need to be implemented in a complex wiring board having various types of electronic circuits formed on the same board or in a narrow area such as a system in package (SiP) or when a high frequency band is required for the operation frequency, as in a network board.

SUMMARY OF THE INVENTION

The present invention provides an electromagnetic bandgap structure and a printed circuit board having the same that can block a noise of a certain frequency band.

The present invention also provides an electromagnetic bandgap structure and a printed circuit board having the same that can block a noise caused by the coupling between a power layer and a ground layer.

The present invention provides an electromagnetic bandgap structure and a printed circuit board having the same that can block a coupling noise of a high frequency in the case of using an operation frequency of high frequency band in a network board.

In addition, the present invention provides an electromagnetic bandgap structure and a printed circuit board having the same that can solve a coupling noise problem through an electromagnetic bandgap structure having a predetermined structural form in a printed circuit board.

An aspect of the present invention features an electromagnetic bandgap structure including a dielectric layer; a plurality of conductive plates; a stitching via, configured to pass through the dielectric layer and have a part electrically connecting the conductive plates to each other by connecting through a planar surface that is different from a planar surface of the conductive plates, and a through via. Here, the dielectric layer, the conductive plates and the stitching via can be placed between any two conductive layers, and the through via can be configured to pass through a clearance hole formed in the conductive layer and electrically connect the two conductive layers to each other.

Here, the stitching via can include a first via, passing through the dielectric layer and having one end part being connected to any one of two adjacent conductive plates; a second via, passing through the dielectric layer and having one end part being connected to the other one of two adjacent conductive plates; and a connection pattern, having one end part being connected to the other end part of the first via and the other end part being connected to the other end part of the second via.

The electromagnetic bandgap structure can further include a different conductive layer between the two conductive layers. Here, the dielectric layer can be placed between the conductive plates and the different conductive layer. At this time, the different conductive layer can be formed with a clearance hole, and the connection pattern can be accommodated in the clearance hole formed the different conductive layer.

The through via can pass through a center part of the conductive plate. Both of the two conductive layers can function as one of a ground layer and a power layer, and the conductive plates can be electrically connected to the other. Alternatively, both of the two conductive layers can function as a ground layer, and the conductive plates are electrically connected to a signal layer.

The conductive plates can be placed on a same planar surface.

Another aspect of the present invention features a printed circuit board including an electromagnetic bandgap structure, arranged in an area of a noise transferable path between a noise source point and a noise blocking destination point of the printed circuit board. Here, the electromagnetic bandgap structure can include a dielectric layer; a plurality of conductive plates; a stitching via, configured to pass through the dielectric layer and have a part electrically connecting the conductive plates to each other by passing through a planar surface that is different from a planar surface of the conductive plates; and a through via. At this time, the dielectric layer, the conductive plates and the stitching via can be placed between any two conductive layers, and the through via can be configured to pass through a clearance hole formed in the conductive layer and electrically connect the two conductive layers to each other.

Here, the stitching via can include a first via, passing through the dielectric layer and having one end part being connected to any one of two adjacent conductive plates; a second via, passing through the dielectric layer and having one end part being connected to the other one of two adjacent conductive plates; and a connection pattern, having one end part being connected to the other end part of the first via and the other end part being connected to the other end part of the second via.

The printed circuit board can further include a different conductive layer between the two conductive layers. Here, the dielectric layer can be placed between the conductive plates and the different conductive layer. At this time, the different conductive layer can be formed with a clearance hole, and the connection pattern can be accommodated in the clearance hole formed the different conductive layer.

The through via can pass through a center part of the conductive plate.

Both of the two conductive layers can function as one of a ground layer and a power layer, and the conductive plates are electrically connected to the other. Alternatively, both of the two conductive layers can function as a ground layer, and the conductive plates are electrically connected to a signal layer.

The conductive plates can be placed on a same planar surface.

If two electronic circuits having different operation frequencies are implemented in the printed circuit board, the noise resource point and the noise blocking destination point can correspond to one position and another position, respectively, in which the two electric circuits are to be implemented.

BRIEF DESCRIPTION OF THE DRAWINGS

These and other features, aspects and advantages of the present invention will become better understood with regard to the following description, appended claims and accompanying drawings where:

FIG. 7 is a graph showing a frequency property of an electromagnetic bandgap structure of FIG. 2.

DETAILED DESCRIPTION OF THE INVENTION

Figure 1:
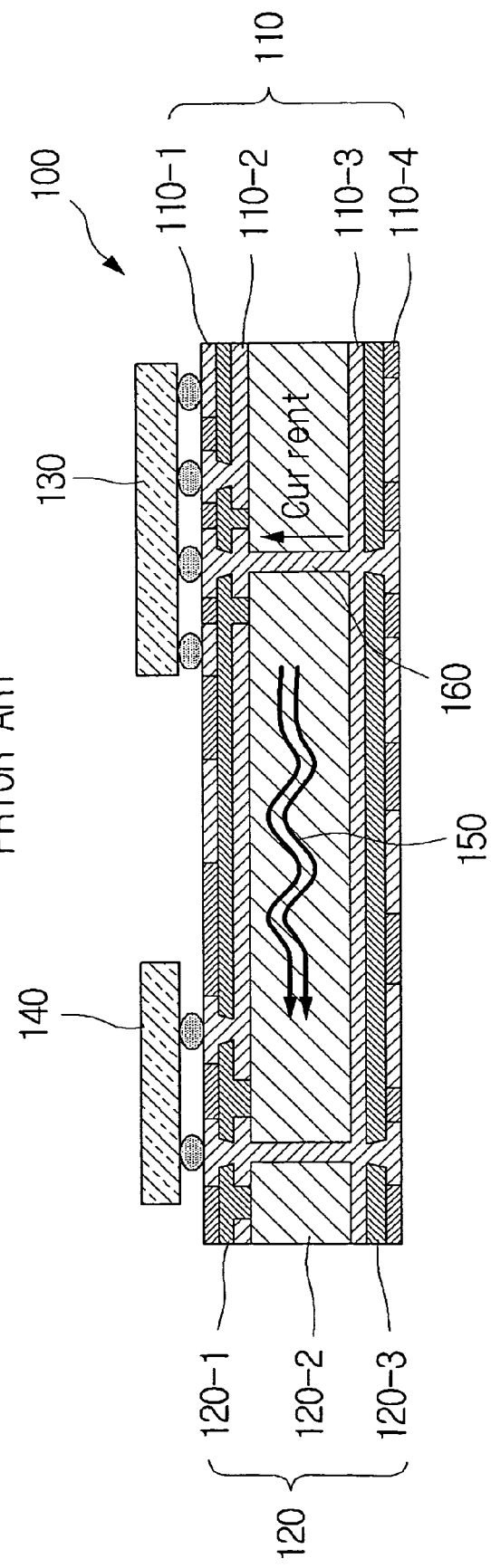
FIG. 1 is a sectional view showing a prior art printed circuit board including two electronic circuits having different operation frequencies.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, an electromagnetic bandgap structure having a stitching via as a comparison object to be directly applied to the present invention in accordance with some embodiments of the present invention will be described with reference to FIG. 2A through FIG. 3E for easy understanding of the present invention before an electromagnetic bandgap structure and a printed circuit board having the same are described with reference to the accompanying drawings.

Although a metal layer and a metal plate are used throughout the description of the structure of an electromagnetic bandgap of the present invention. However, it shall be evidently understood by any person of ordinary skill in the art that any other conductive layers and plates can be substituted for the metal layer and the metal plate.

Also, it can be easily recognized though the comparison with the below description related to FIG. 4 that the electromagnetic bandgap structure 300 in accordance with an embodiment of the present invention can be what a through via (refer to the reference numeral 330 of FIG. 4 through FIG. 5B) is added to the electromagnetic bandgap structure 200 having the stitching via shown in FIG. 2A).

Figure 4:
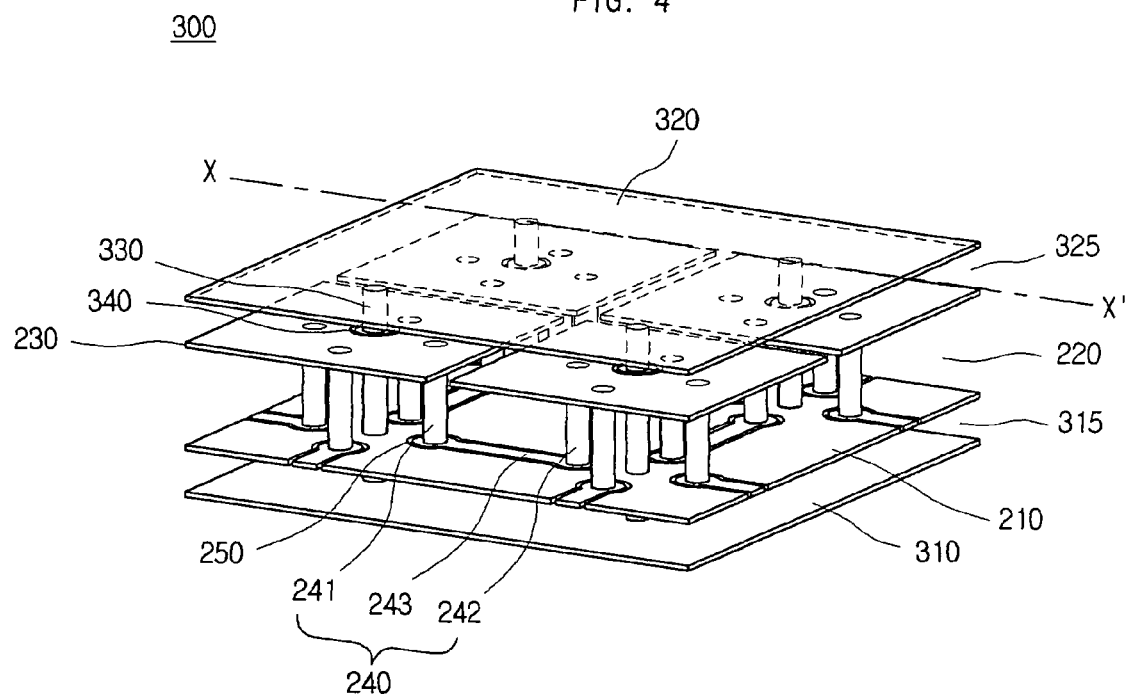
FIG. 4 is a 3-D perspective view showing an electromagnetic bandgap structure including a stitching via and a though via in accordance with an embodiment of the present invention.

Here, the through via can electrically connect two different metal layers (e.g. a first metal layer 310 and a third metal layer 320, each of which will function as a ground layer in the case of FIG. 4) to each other by passing through a clearance hole (refer to the reference numeral 340 of FIG. 4 through FIG. 5B) formed in a metal plate (refer to the reference numeral 230 of FIG. 2A and FIG. 4 through FIG. 5B).

Figure 2A:
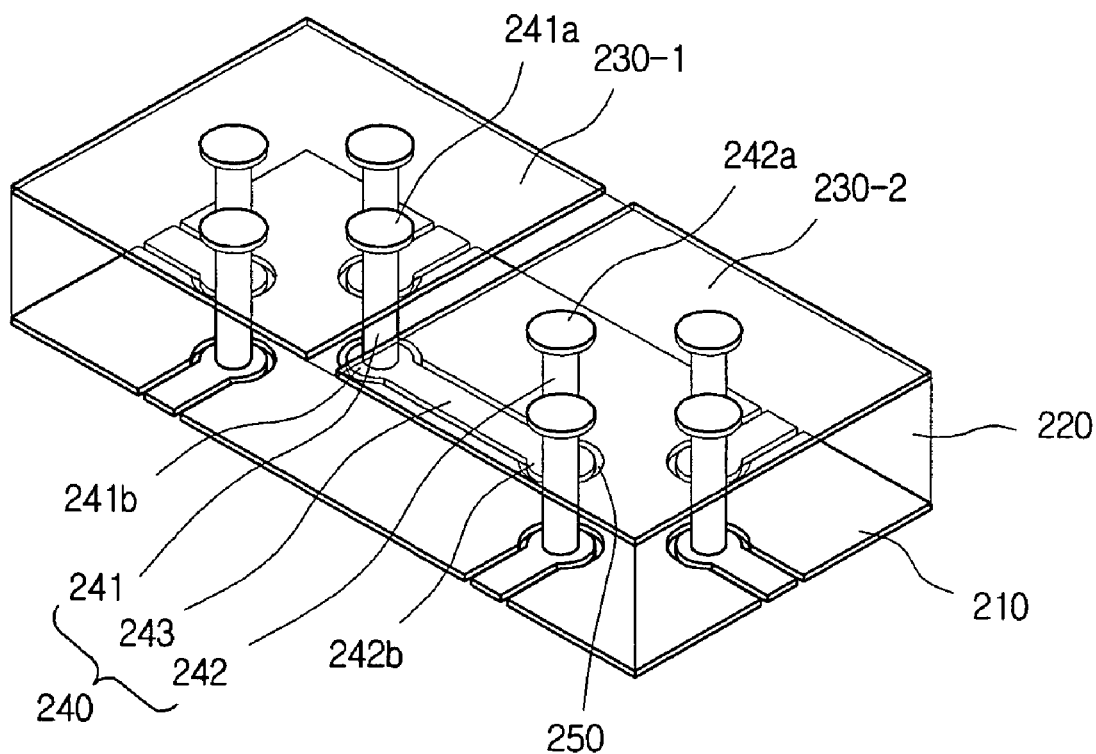
FIG. 2A is a 3-D perspective view showing an example of an electromagnetic bandgap structure including a stitching via as a comparison object of the present invention.

FIG. 2A is a 3-D perspective view showing an example of an electromagnetic bandgap structure including a stitching via as a comparison object to be applied to the present invention.

The electromagnetic bandgap structure 200 of FIG. 2A includes a metal layer (hereinafter, referred to as "a first metal layer 210" to be compared with FIG. 4), a dielectric layer (hereinafter, referred to as "a first dielectric layer 220" to be compared with FIG. 4) stacked in the first metal layer 210, a plurality of metal plates 230-1 and 230-2 (hereinafter, referred to as "a first metal plate" and "a second metal plate" for the convenience of description) stacked in the first dielectric layer 220).

In other words, the electromagnetic bandgap structure 200 can typically have 2-layered planar-surface structural form including a first layer in which the first metal layer 210 is placed and a second layer in which the plurality of metal plates 230-1 and 230-2 are placed.

Figure 2B:
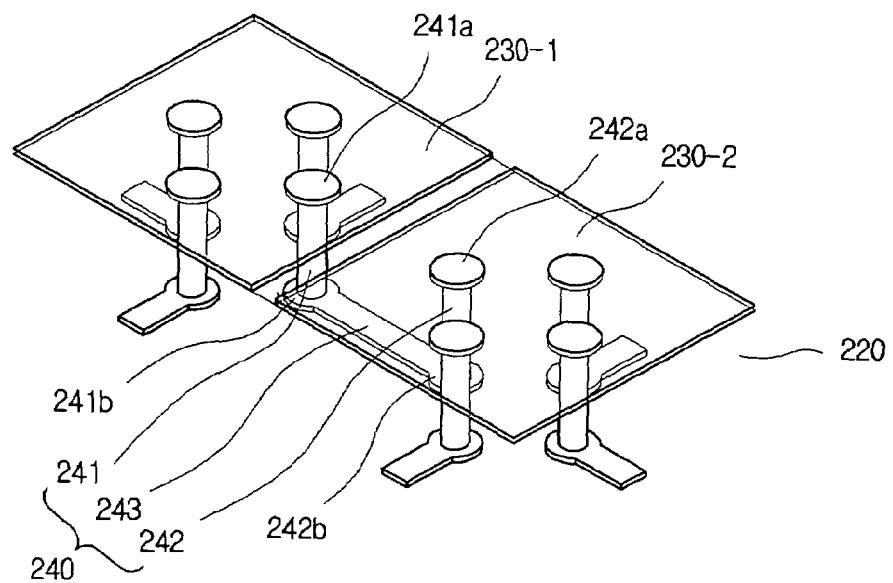
FIG. 2B is a 3-D perspective view showing another example of an electromagnetic bandgap structure including a stitching via as a comparison object of the present invention.

Here, FIG. 2A merely show elements constituting the electromagnetic bandgap structure (i.e. a part constituting the 2-layered electromagnetic bandgap including the stitching via) for the convenience of illustration (also, in the case of FIG. 2B and FIG. 3). Accordingly, the first layer in which the first metal layer 210 shown in FIG. 2A is placed and the second layer in which the plurality of metal plates 230-1 and 230-2 shown in FIG. 2A are placed may be any two layers of a multi-layered printed circuit board.

In other words, it shall be obvious that there can be at least one additional metal layer below the first metal layer 210, above the metal plates 230-1 and 230-2 and/or between the first metal layer 210 and the metal plates 230-1 and 230-2.

For example, the electromagnetic bandgap structure 200 shown in FIG. 2A can be placed between any two metal layers functioning as the power layer and the ground layer, respectively, in a multi-layered printed circuit board in order to block the conductive noise (the same can be applied to electromagnetic bandgap structures shown in FIG. 2B and FIG. 4 through FIG. 5B in accordance with other embodiments of the present invention).

Since the conductive noise problem is not limited to the space between the power layer and the ground layer, the electromagnetic bandgap structure shown in FIG. 2A can be placed between any two ground layers or power layers placed on different layers from each other in a multi-layered printed circuit board.

Accordingly, the first metal layer 210 may be any metal layer for transferring an electric signal in a printed circuit board. The first metal layer 210, for example, can be any metal layer functioning as the power layer or the ground layer or any metal layer functioning as a signal layer constituting a signal line.

The first metal layer 210 can be placed on a planar surface different from the planar surface in which the plurality of metal plates are placed and electrically separated from the plurality of metal plates 230-1 and 230-2. In other words, the first metal layer 210 can form a layer that is different from the plurality of metal plates 230-1 and 230-2 in regard to electrical signals in the printed circuit board.

For example, if the first metal layer 210 is the power layer, the metal plates can be electrically connected to the ground layer. If the first metal layer 210 is the ground layer, the metal plates can be electrically connected to the power layer. Alternatively, if the first metal layer 210 is the signal layer, the metal plates can be electrically connected to the ground layer. If the first metal layer 210 is the ground layer, the metal plates can be electrically connected to the signal layer.

The plurality of metal plates 230-1 and 230-2 can be placed on a planar surface above the metal layer 210. Any two metal plates can be electrically connected to each other through a stitching via. As such, each stitching via electrically connecting any two metal plates to each other can electrically connect every metal plate as one circuit.

Here, FIG. 2A shows the form (i.e. the form of FIG. 3A) that a metal plate and its adjacent metal plates can be electrically connected to each other through each one stitching via, and as a result, every metal plate can be electrically connected to each other. However, as long all metal plates can be formed as a closed loop by being electrically connected to each other, it can be possible to use any method of connecting the metal plates to each other through the stitching via.

Also, even though FIG. 2A shows only two metal plates having square shapes of the same size for the convenience of illustration, various other modifications can be possible. This will be briefly described with reference to FIG. 3A through FIG. 3E.

Figure 3A:
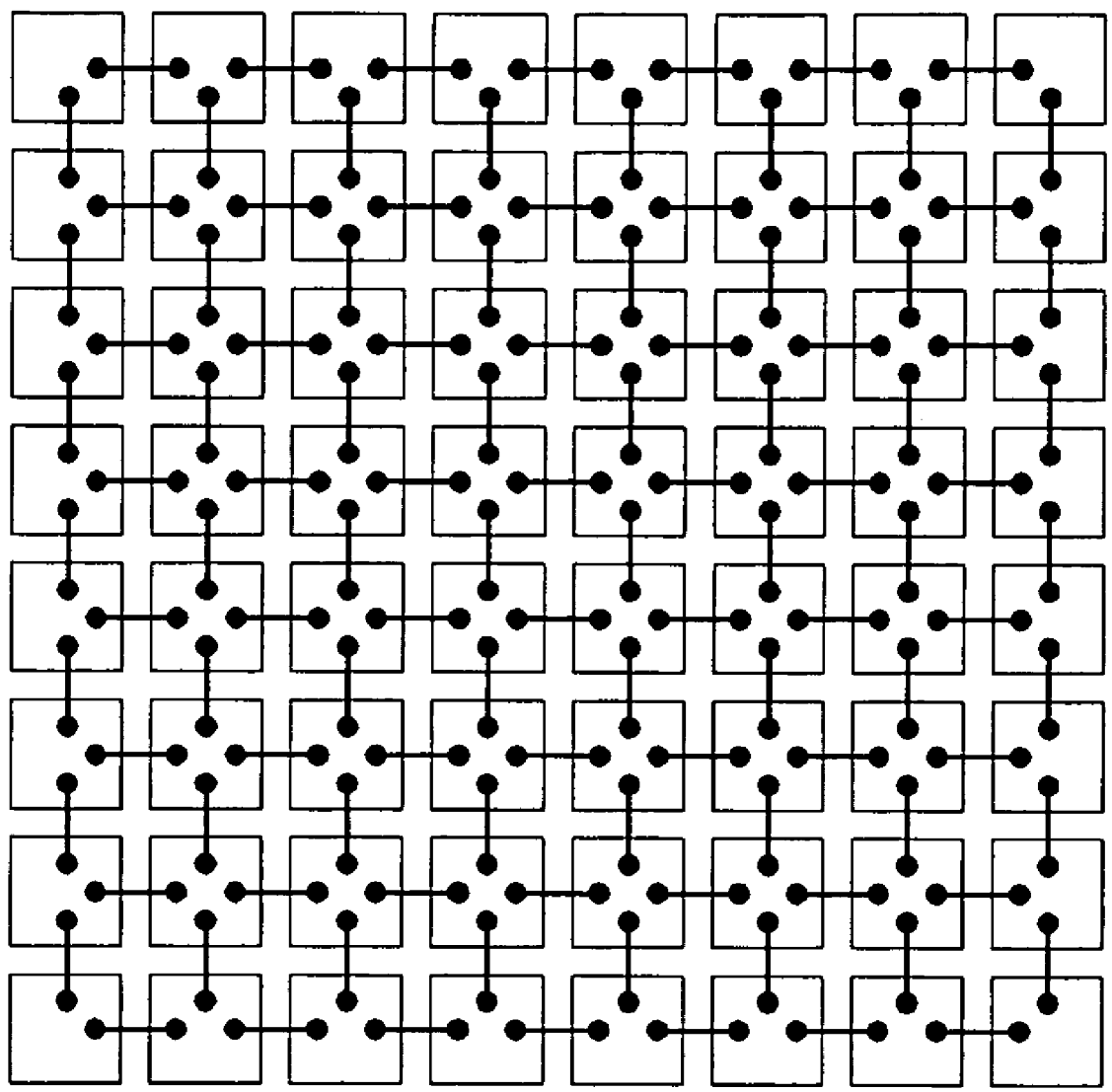
FIG. 3A is a plan view showing a configuration of an electromagnetic bandgap structure of FIG. 2 including a rectangular metal plate.
Figure 3B:
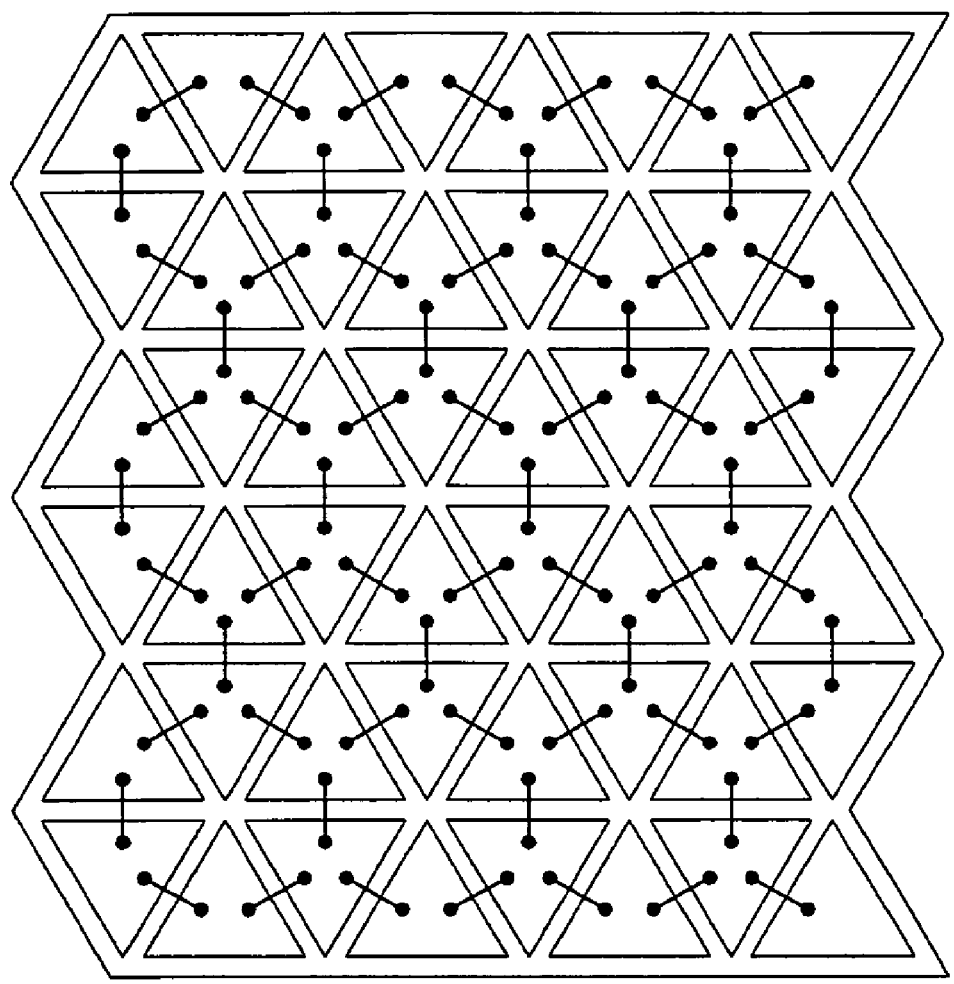
FIG. 3B is a plan view showing a configuration of an electromagnetic bandgap structure of FIG. 2 including a triangular metal plate.
Figure 3C:
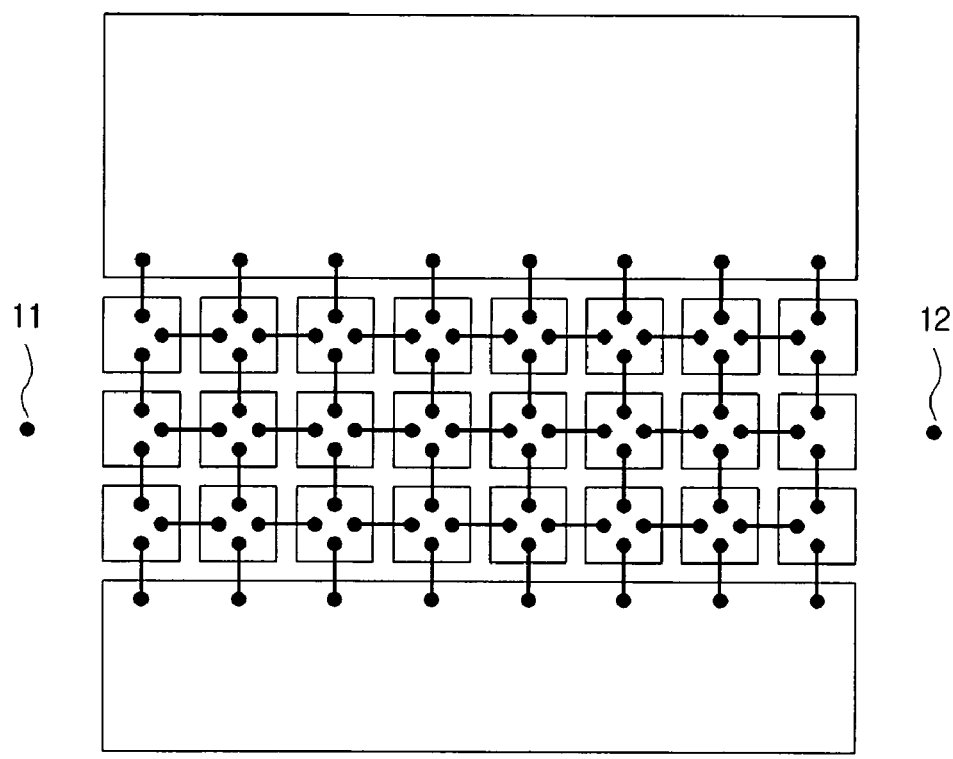
FIG. 3C is a plan view showing a band-shaped configuration of an electromagnetic bandgap structure of FIG. 2.

For example, the metal plates can have various polygonal shapes including not only a rectangle as shown in FIG. 3A, and a triangle, as shown in FIG. 3B, but also a hexagon, an octagon. Of course, the metal plate may not be limited to a certain shape such as a circle or an ellipse. Each of the metal plates can also have the same size (e.g. area and thickness) as shown in FIG. 3A, FIG. 3B and FIG. 3C. If the metal plates have different sizes, the metal plates can be distinguished and disposed according to each of a plurality of groups having different sizes as shown in FIG. 3D or FIG. 3E.

Figure 3D:
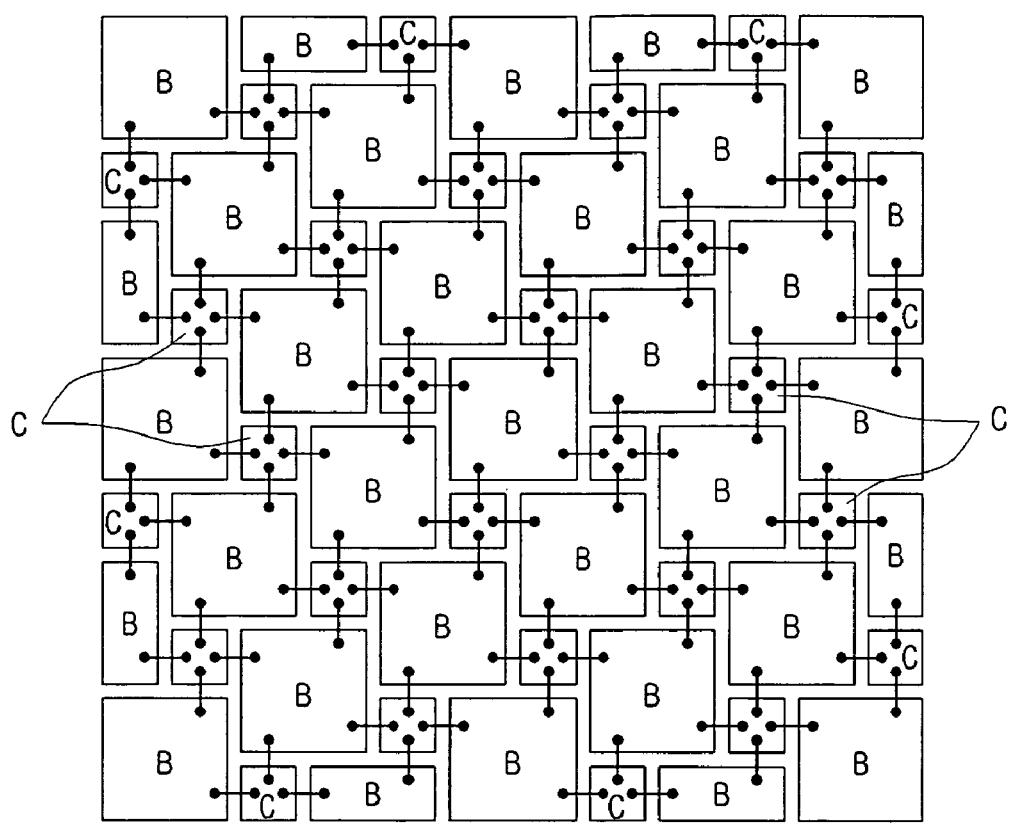
FIG. 3D and FIG. 3E are plan views showing a configuration of an electromagnetic bandgap structure of FIG. 2 according to the sizes of metal plates

In the case of FIG. 3D, metal plates B having a relatively bigger size and metal plates C having a relatively smaller size can be alternately arranged, and each metal plate can be electrically connected to its adjacent metal plates, respectively, through the stitching vias.

Figure 3E:
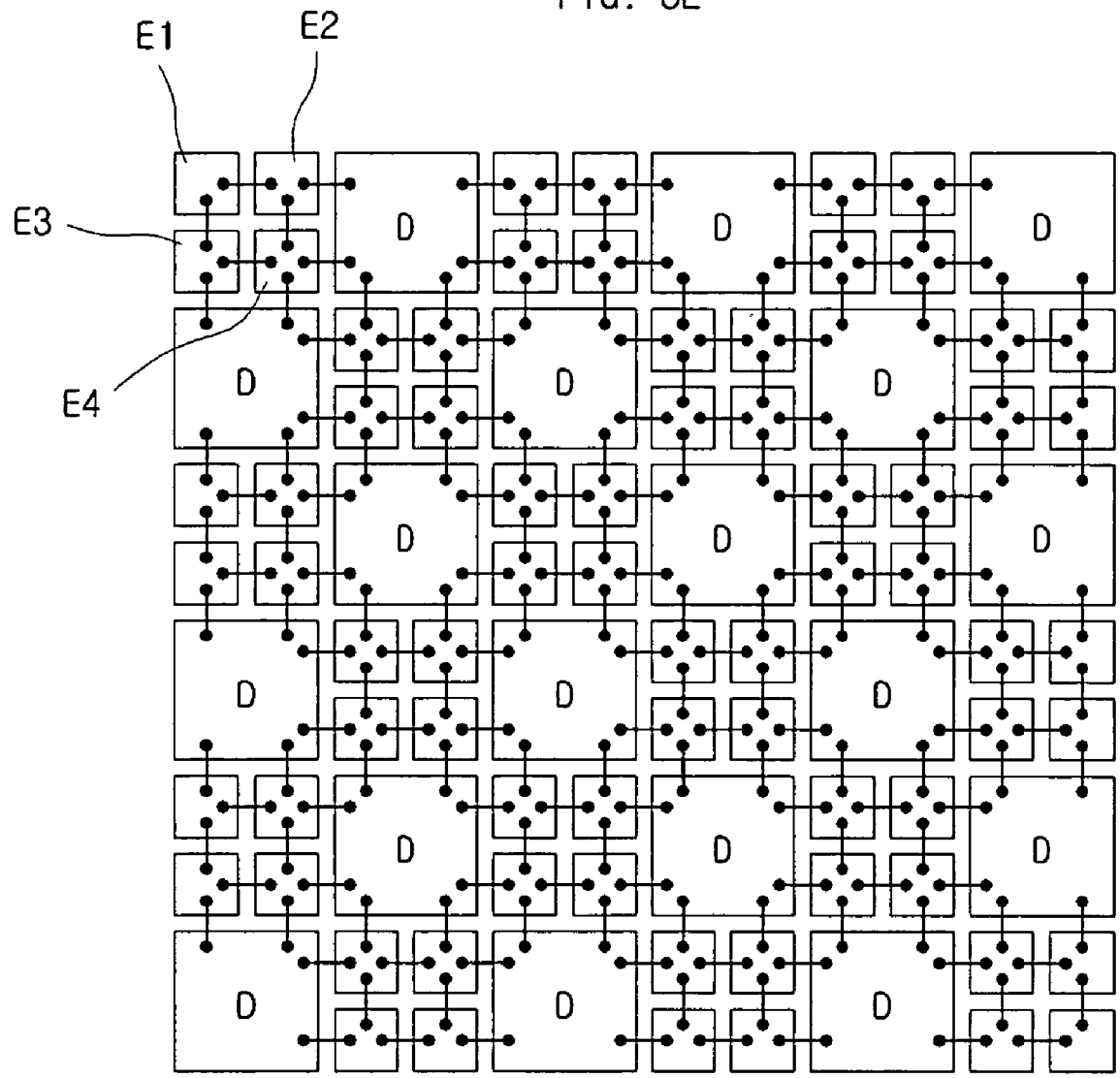

In the case of FIG. 3E, metal plates D having a relatively bigger size and metal plates E1, E2, E3 and E4 having a relatively smaller size can be arranged. The small metal plates E1, E2, E3 and E4 can be grouped in a 2×2 form. Each group consisting of the 4 small metal plates E1, E2, E3 and E4 can occupy the area similar to the large metal plate D. The small metal plates E1, E2, E3 and E4 can be electrically connected to corresponding adjacent metal plates through 4 stitching vias. Also, since there are 8 small metal plates around the large metal plate D, the large metal plate D can be electrically connected to its adjacent small metal plates through 8 stitching vias.

Since FIG. 3A through FIG. 3E show each of the electromagnetic bandgap structures arranged in the printed circuit board when viewed from an upper surface, each one metal plate can correspond to each cell of the electromagnetic bandgap structure.

In particular, FIG. 3A, FIG. 3B, FIG. 3D and FIG. 3E show the case that the electromagnetic bandgap structures are repeatedly arranged on the whole part of an inner surface of the printed circuit board. FIG. 3C shows the case that the electromagnetic bandgap structures are arranged on a part of an inner surface of the printed circuit board.

Briefly, while the cells of the electromagnetic bandgap structures can be densely arranged on the whole part of an inner surface of the printed circuit board as shown in FIG. 3A, the cells can be naturally arranged on some paths as shown in FIG. 3C.

For example, as shown in FIG. 3C, if it is assumed that a point 11 refers to a noise source point and a point 12 refers to a noise blocking destination point, the cells can be repeatedly arranged in at least one line along a noise transferable path between the noise source point 11 and the noise blocking destination point 12. Alternatively, as shown in FIG. 3C, if it is assumed that a point 21 refers to the noise source point and a point 22 refers to the noise blocking destination point, the cells can be arranged in at least one line to have the shape crossing and blocking a noise transferable path between the noise source point 21 and the noise blocking destination point 22 (i.e. the shape of being shielded by a blocking shield).

Here, if it is assumed that any two electronic circuits having different operation frequencies (refer to the first electronic circuit 130 and the second electronic circuit 140 in FIG. 1, described above) are implemented in the printed circuit board, the noise resource point and the noise blocking destination point can correspond to one position and another position, respectively, in which the two electric circuits are to be implemented.

A stitching via can electrically connect any two of a plurality of metal plates to each other. All drawings of this specification show that the stitching via electrically connects two adjacent metal plates to each other. However, it may be unnecessary that any two metal plates connected by the stitching via are adjacent to each other.

Also, even though it is shown that one metal plate is connected to another metal plate by one stitching via, it is obviously unnecessary that the electromagnetic bandgap structure has any limitation to the number of the stitching vias connecting any two metal plates.

However, all below descriptions focus on the case that two adjacent metal plates are connected to each other by one stitching via.

The stitching via 240 can be formed to include a first via 241, a second via 242 and a connection pattern 243 in order to electrically connect two adjacent metal plates.

Herein, the first via 241 can be formed to start from one end part 241a connected to the first metal plate 230-1 and penetrate the first dielectric layer 220, and the second via 242 can be formed to start from one end part 242a connected to the second metal plate 230-2 and penetrate the first dielectric layer 220. The connection pattern 243 can be placed on the same planar surface as the metal layer 210 and have one end part, connected to the other end part 241b of the first via 241, and the other end part, connected to the other end part 242b of the second via 242.

At this time, it is obvious that a via land having a larger size than the via can be formed at one end part and the other end part of each via in order to reduce a position error of a drilling process for forming the via. Accordingly, the pertinent detailed description will be omitted.

Also, a clearance hole 250 can be formed at an edge of the connection pattern 243 of the stitching via 240 in order to prevent the metal plates 230-1 and 230-2 to be electrically connected to the first metal layer 210. In other words, the connection pattern 243 can be accommodated in the clearance hole 250.

It shall be evident here that, in order to allow the metal plates to be electrically connected to each other, it is necessary that a plating layer be formed on an inner wall only of the first via 241 and the second via 242 of the stitching via 240 or the inside of the stitching via 240 be filled with a conductive material (e.g. a conductive paste), and the connection pattern 243 be a conductive material such as a metal.

As a result, the two adjacent metals 230-1 and 230-2 may not be connected on the same planar surface in the electromagnetic bandgap structure of FIG. 2A. Instead, the two adjacent metals 230-1 and 230-2 can be connected to each other through another planar surface (i.e. the same planar surface as the metal layer 210) by the stitching via 240. Accordingly, the electromagnetic bandgap structure 200 having the stitching via 240 of FIG. 2A can more easily acquire an inductance component with a longer length than that of connecting the adjacent metal plates to each other on the same planar surface under the same conditions.

In addition, since the adjacent metal plates of the present invention are connected to each other by the stitching via 240, it is unnecessary to form an additional pattern for electrically connecting the metal plates placed on two layers. This can make a spaced distance between the metal plates narrower. Accordingly, it can be possible to increase the capacitance component formed between the adjacent metal plates.

Below is described the principle by which the structure shown in FIG. 2A can function as the electromagnetic bandgap structure blocking a signal of a certain frequency band.

The first dielectric layer 220 can be interposed between the first metal layer 210 and the metal plates 230-1 and 230-2. This may cause a capacitance component to be formed between the metal layer 210 and the metal plates 230-1 and 230-2 and between the two adjacent metal plates. Also, there can be an inductance component connecting through the first via 241→the connection pattern 243→the second via 242 between the two metal plates that are adjacent to each other by the stitching via 240.

At this time, the value of the capacitance component can be varied according to various factors such as the spaced distances between the metal layer 210 and the metal plates 230-1 and 230-2 and between the two adjacent metal plates, the dielectric constant of a dielectric material forming the dielectric layer 220 and the size, shape and area of the metal plate. Also, the value of the inductance component can be varied according to various factors such as the shape, length, depth, width and area of the first via 241, a second via 242 and/or the connection pattern 243.

Accordingly, adjusting and designing various aforementioned factors adequately can make it possible to allow the structure of FIG. 2A to function as the electromagnetic bandgap structure (i.e. a band stop filter) for removing or blocking a certain noise or a certain signal of an object frequency band. This can be easily understood through the equivalent circuit of FIG. 2C.

Figure 2C:
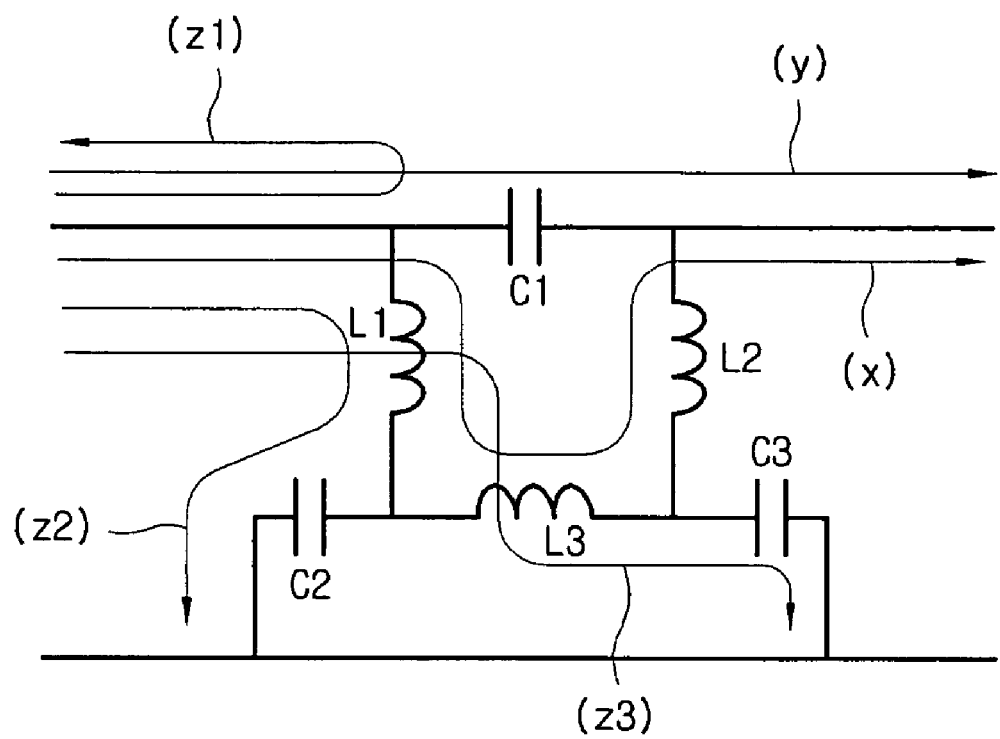
FIG. 2C shows an equivalent circuit of the electromagnetic bandgap structure shown in FIG. 2A

Comparing the equivalent circuit of FIG. 2C with the electromagnetic bandgap structure of FIG. 2A, an inductance component L1 can correspond to the first via 241, and an inductance component L2 can correspond to the second via 242. An inductance component L3 can correspond to the connection pattern 243. C1 can be a capacitance component by the metal plates 230-1 and 230-2 and another dielectric layer and another metal layer to be placed above the metal plates 230-1 and 230-2. C2 and C3 can be capacitance components by the metal layer 210 placed on the same planar surface as the connection pattern 243 and another dielectric layer and another metal layer to be placed below the planar surface of the connection pattern 243.

The electromagnetic bandgap structure shown in FIG. 2A can function as a band stop filter, which blocks a signal of a certain frequency band according to the above equivalent circuit.

In other words, as seen in the equivalent circuit of FIG. 2C, a signal x of a low frequency band (refer to FIG. 2C) and a signal y of a high frequency band (refer to FIG. 2C) can pass through the electromagnetic bandgap structure, and signals z1, z2 and z3 of a certain frequency band (refer to FIG. 2C) ranging between the low frequency band and the high frequency band are blocked by the electromagnetic bandgap structure.

Accordingly, if the structure of FIG. 2A is repeatedly arranged on a whole part (refer to FIG. 3A. FIG. 3B, FIG. 3D and FIG. 4E) or a part (refer to FIG. 3C) of an inner surface of the printed circuit board (the same can be applied to the structure of FIG. 3) as a noise transferable path, it is possible to function as the electromagnetic bandgap structure that can prevent a signal of a certain frequency band from being transferred.

The identical or similar idea can be applied to the electromagnetic bandgap structure of FIG. 2B.

The electromagnetic bandgap structure of FIG. 2B has no first metal layer corresponding to the first metal layer 210 as compared with the electromagnetic bandgap structure of FIG. 2A.

It may be unnecessary that the electromagnetic bandgap structure having a stitching via include a metal layer, placed below an area in which there is the stitching via and. This may be because it is not always necessary that the connection pattern 243 of the stitching via 240 be formed on a space in which there is the metal layer.

In other words, if there is a metal layer on the same planar surface to correspond to an area on which the connection pattern 243 will be formed, the connection pattern 243 can be manufactured in the form of being accommodated in the clearance hale 250 formed in the first metal layer 210 on the same planar surface as shown in FIG. 2A. However, no additional metal may be placed in the area in which the connection pattern 243 will be formed, as shown in FIG. 2B. Of course, there may be the first dielectric layer 220 below the metal plates in FIG. 2B.

Also, it may not be always necessary that the 2-layered electromagnetic bandgap structure including the stitching via is formed to have a stacked structural form in which the metal plates 230-1 and 230-2 are stacked in the first dielectric layer 220 and the dielectric layer 220 is stacked in the metal layer 210. In other words, the 2-layered electromagnetic bandgap structure including the stitching via can be formed to have another structural shape including a lower layer in which the metal plates are placed, an upper layer in which the metal layer is placed, the dielectric layer interposed between the lower layer and the upper layer and the stitching via, penetrating the dielectric layer (i.e. a structural form, with the position of the upper layer and the lower layer inversed from that of FIG. 2A). Of course, it can be expected that the electromagnetic bandgap structure shown in FIG. 2A has the identical or similar noise blocking effect to that of FIG. 2B. Although all of the foresaid drawings show that all metal plates are stacked in the same planar surface, it is not always necessary that all metal plates are stacked in the same planar surface. In case at least one of the metal plates is stacked in a planar surface that is different from the planar surface in which the other metal plates are stacked, the electromagnetic bandgap structure will have two or more layers. However, this increased number of layers may have no disadvantageous effect on the design when the electromagnetic bandgap structure of the present invention is applied to a multi-layered printed circuit board.

Hereinafter, an electromagnetic bandgap structure and a printed circuit board including the same in accordance with an embodiment of the present invention will be described. However, any matter already described in FIG. 2 through FIG. 3B will be not be redundantly described, and the electromagnetic bandgap structure and the printed circuit board including the same will be briefly described based on the features of each embodiment of the present invention.

Firstly, it is recognized that the electromagnetic bandgap structure, shown in the related drawings, in accordance with the embodiments of the present invention has the same structural shape as that of FIG. 2A through FIG. 2C, except for further including a through via. Accordingly, it can be clearly understood by any person of ordinary skill in the art that the general details of the above-described electromagnetic bandgap structure shown in FIG. 2A through FIG. 3E and its noise blocking principle can be identically or similarly applied to the below-described electromagnetic bandgap structure in accordance with the embodiments of the present invention.

Figure 5A:
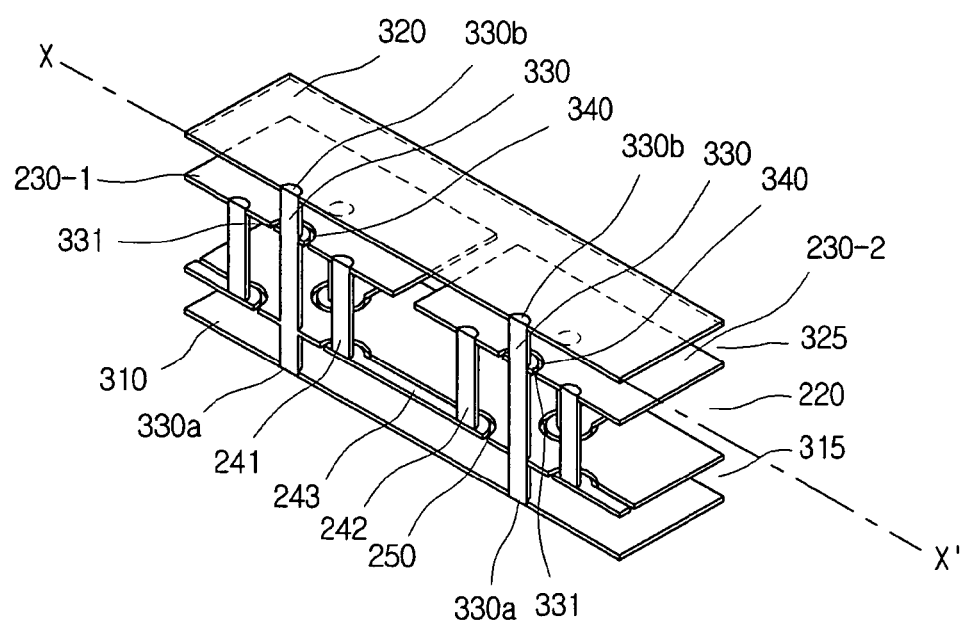
FIG. 5A shows a sectional viewed along the X-X' line of the 3-D perspective view of FIG. 4.

FIG. 4 is a 3-D perspective view showing an electromagnetic bandgap structure including a stitching via and a though via in accordance with an embodiment of the present invention. FIG. 5A shows a sectional viewed along the X-X' line of the 3-D perspective view of FIG. 5, and FIG. 5B is a perspective view showing the electromagnetic bandgap structure of FIG. 4 without a third metal layer.

Figure 5B:
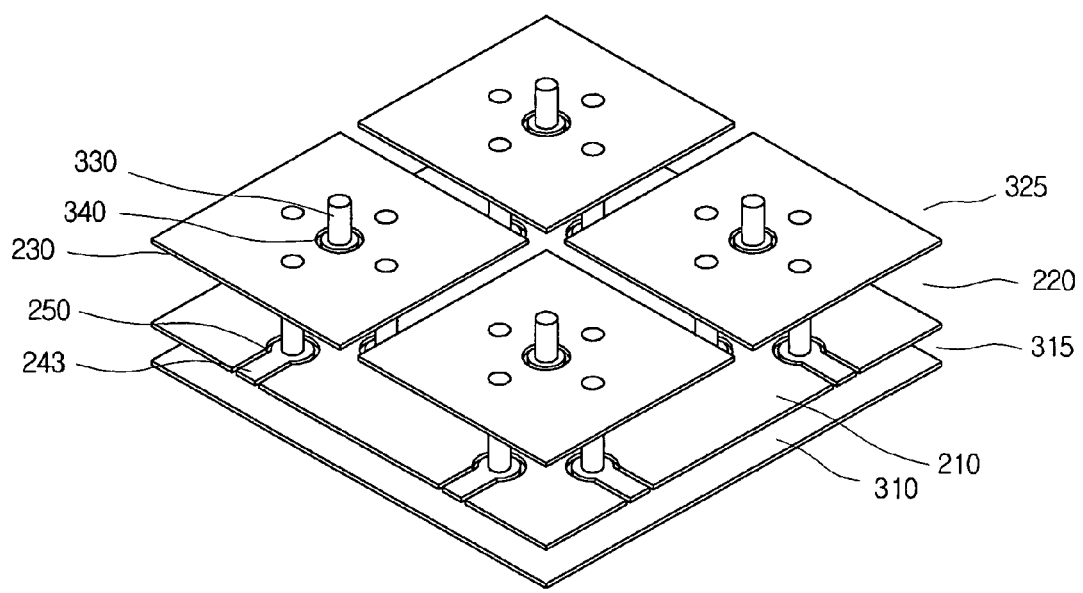
FIG. 5B is a perspective view showing the electromagnetic bandgap structure of FIG. 4 without a third metal layer.

As shown in FIG. 4 through FIG. 5B, the electromagnetic bandgap structure 300 can include a second metal layer 310, a second dielectric layer 315 stacked in the second metal layer 310, a first metal layer 210 stacked in the second dielectric layer 315, a first dielectric layer 220 stacked in the first metal layer 210, a plurality of metal plates 230-1 and 230-2 (hereinafter, referred to as 230) stacked in the first dielectric layer 220, a stitching via 240 electrically connecting any two metal plates to each other, a third dielectric layer 325 stacked in the metal plates 230, a third metal layer 320 stacked in the third dielectric layer 325 and a through via 330.

In other words, a structure, such as the electromagnetic bandgap structure 200 having the stitching via of FIG. 2A can be placed between any two metal layers (e.g. the second metal layer 310 and the third metal layer 320, in FIG. 4 and FIG. 5A) of the electromagnetic bandgap structure 300 in accordance with an embodiment of the present invention. Further, the electromagnetic bandgap structure 300 in accordance with an embodiment of the present invention can be what a through via is added to the electromagnetic bandgap structure 200 having the stitching via shown in FIG. 2A.

At this time, the first metal layer 210, the second metal layer 320 and the third metal layer 330 can form a same layer in regard to electrical signals. As a result, the first metal layer 210, the second metal layer 320 and the third metal layer 330 can be electrically connected to each other as one circuit.

As shown in FIG. 4 through FIG. 5B, the first metal layer 210, the second metal layer 320 and the third metal layer 330 can be electrically connected to each other through the though via 330. In particular, the through via 330 can have one end part 330a connected to the second metal layer 310 and the other end part 330b passing through the first metal layer 210 and connected to the third metal layer 320.

However, since the plurality of metal plates 230 can form a layer that is different from that of the first metal layer 210 in regard to electrical signals as described above, the plurality of metal plates 230 can form a layer that is different from that of the second metal layer 310 and the third metal layer 320 in regard to electrical signals. In other words, if the above metal layers function as a power layer, the metal plate can be connected to a ground layer. Inversely, if the metal layers function as the ground layer, the metal plate can be connected to the power layer.

Alternatively, if the above metal layers function as a signal layer, the metal plate can be connected to the ground layer. Inversely, if the above metal layers function as the ground layer, the metal plate can be connected to the signal layer. For example, if all of the first metal layer 210, the second metal layer 320 and the third metal layer 330 function as the ground layer, the through via 330 can function as a ground via for electrically connecting the ground layers to each other as one circuit.

Accordingly, it may be necessary that the though via 330 be electrically disconnected from the metal plates 230. This is because if the through via 330 is assumed to be electrically connected to the metal plates 230, the metal plates 230 can be electrically connected to the metal layers 210, 310 and 320.

Accordingly, a clearance hole 340 (hereinafter, referred to as "a second clearance hole" for easy distinguishment from the first clearance hole 250 formed in the first metal layer 210) can be formed in a predetermined area (e.g. a center part or another area in FIG. 4 through FIG. 5B) of the metal plate 230.

The through via 330 can be electrically disconnected from the metal plates 230 and electrically connected to the metal layers 210, 310 and 320 by passing through the second clearance hole 340.

It can be necessary that the second clearance hole 340 be formed to have an area capable of accommodating a via land (refer to the reference numeral 331 of FIG. 5A) that is formed to reduce a position error of a drilling process for forming the through via 330.

As such, an embodiment of the present invention suggests the method of electrically connecting the other metal layers 310 and 320 to each other through the though via 330 that passes through the second clearance hole 340 formed in the metal plate 230 when the electromagnetic bandgap structure 200 as shown in FIG. 2A is arranged in a multi-layered printed circuit board.

Although the method can be simply realized by using the typical process of manufacturing a printed circuit board, further including the through via 330 can have more outstanding noise blocking effect, especially, in a high frequency band as compared with the electromagnetic bandgap structure 200 in accordance with the present invention.

Figure 6:
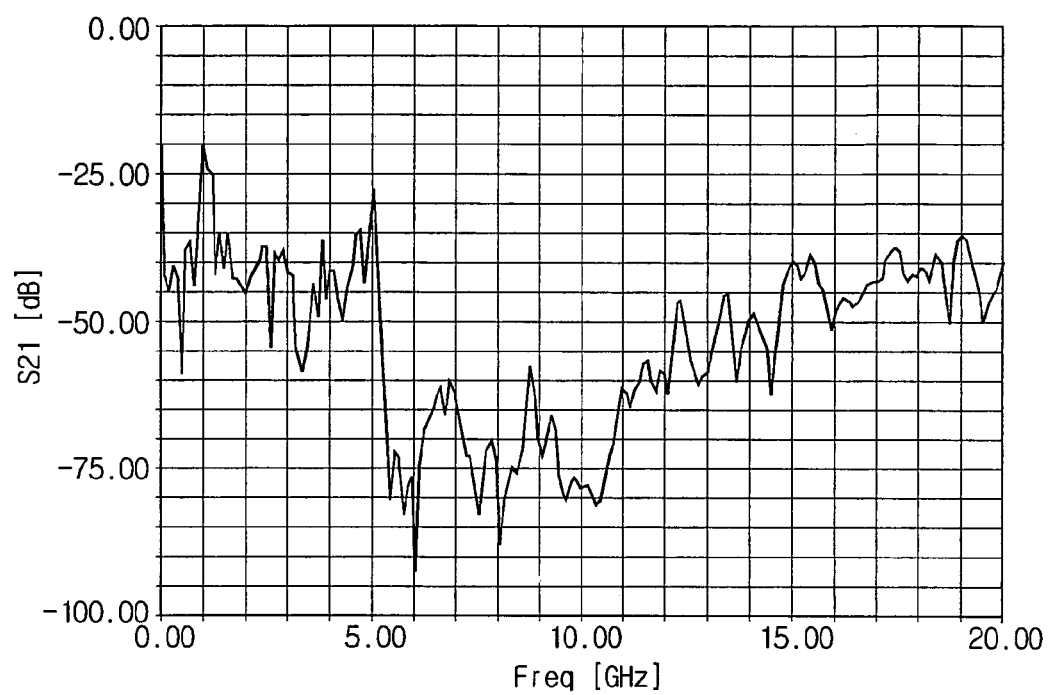
FIG. 6 is a graph showing a frequency property of an electromagnetic bandgap structure of FIG. 4.

This effect can be clearly seen through the comparison of frequency property graphs of FIG. 6 and FIG. 7. FIG. 6 is a graph showing a frequency property of an electromagnetic bandgap structure of FIG. 4.

FIG. 7 is a graph showing a frequency property of an electromagnetic bandgap structure of FIG. 2.

As shown in FIG. 6, it can be recognized that the electromagnetic bandgap structure 300 having both the stitching via and the through via of the present invention has the bandgap frequency band of between about 5.2 and 14.6 GHz on a blocking rate −50 dB basis. However, the comparison object electromagnetic bandgap structure 200 having the stitching via only has the bandgap frequency band of between about 2.8 and 7.5 GHz on a blocking rate −50 dB basis.

This result proves that the electromagnetic bandgap structure 300 having the stitching via and the through via can have the broader noise blocking range and more outstanding noise blocking effect in a high frequency band than the electromagnetic bandgap 200 having the stitching via.

Below is the reason for the result. The electromagnetic bandgap structure 300 can further have a self inductance component through the through via 330 in addition to the stitching via 330. Also, the mutual inductance component can be caused by allowing the through via 330 to formed in the direction that is orthogonal to the transferring direction of an electrical signal. This can get the bandgap frequency to move righter (i.e. to the high frequency band) as compared with the electromagnetic bandgap structure 200.

This indicates that the electromagnetic bandgap structure 300 can be very useful to block a coupling noise of a high frequency by applying the electromagnetic bandgap structure 300 to an electronic apparatus that uses an operation frequency of a high frequency band.

For example, if the electromagnetic bandgap structure 300 is applied to a network board that typically uses an operation frequency band between about 3 and 10 GHz, it can be possible to more easily solve the problem of a coupling noise of a high frequency band in the network board.

Such as, a noise of a certain frequency band can be blocked or reduced by arranging the electromagnetic bandgap structure 300 of the present invention in an area of a noise transferable path between a noise source point and a noise blocking destination point of a multi-layered printed circuit board.

For example, if two or more digital circuits having different operation frequencies are implemented in different areas of a printed circuit board, since any one digital circuit becomes a noise source to another digital circuit, the electromagnetic bandgap structure 300 can be arranged between each digital circuit in order to present a coupling noise caused by any one digital circuit from being transferred to another digital circuit and having an effect on the normal operation of another digital circuit.

Although the simulation result of FIG. 6 shows that the bandgap frequency band of the present invention ranges between about 5.2 and 14.6 GHz, the bandgap frequency band can be varied according to the change of design values such as the shape, length, area and width of the through via 330.

Of course, as described above, it shall be obvious that the bandgap frequency and its blocking rate can be varied according to the change of a capacitance value caused by the factors such as a spaced distance of the metal plate, a dielectric constant of a dielectric material forming each dielectric layer, the thickness of each dielectric layer and the size, shape and area of the metal plate and the change of an inductance value caused by the factors such as the shape, length, thickness, width and area of the stitching via.

Although the printed circuit board having a total of 4 layers, the first metal layer 210, the metal plate 230, the second metal layer 310 and the third metal layer 320 is used through the description related to FIG. 4 through FIG. 7, it shall be obvious that the present invention can be applied to a multi-layered printed circuit board having 6, 8 or more layers. Also, even though FIG. 4 through FIG. 6 shows the case of the second metal layer 310 adjacent to an area below the first metal layer 210 and the third metal layer 320 adjacent to an area above the metal plate 230, the present invention is not limited to the case of FIG. 4 through FIG. 6.

In other words, it is sufficient that the other metal layers are any metal layers forming the same electrical signal layer as the first metal layer 210 regardless of their positions. It is not always necessary that the number of the other metal layers connected by the through via 330 is two, and three or more same electrical signal layers can be electrically connected to each other through the through vias 330.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

What is claimed is:

1. An electromagnetic bandgap structure, comprising:
a dielectric layer;
a plurality of conductive plates;
a stitching via, configured to pass through the dielectric layer and have a part electrically connecting the conductive plates to each other by connecting through a planar surface that is different from a planar surface of the conductive plates; and
a through via,
wherein the dielectric layer, the conductive plates and the stitching via are placed between two conductive layers, and the through via is configured to pass through a clearance hole formed in each of the conductive plates and electrically connect the two conductive layers to each other, and the stitching via comprises
a first via, passing through the dielectric layer and having one end part being connected to any one of two adjacent conductive plates of the plurality of conductive plates,
a second via, passing through the dielectric layer and having one end part being connected to the other one of two adjacent conductive plates of the plurality of conductive plates, and
a connection pattern, having one end part being connected to the other end part of the first via and the other end part being connected to the other end part of the second via.

2. The electromagnetic bandgap structure of claim 1, further comprising a different conductive layer between the two conductive layers, wherein the dielectric layer is placed between the conductive plates and the different conductive layer.

3. The electromagnetic bandgap structure of claim 2, wherein the different conductive layer is formed with a clearance hole, and
the connection pattern is accommodated in the clearance hole formed the different conductive layer.

4. The electromagnetic bandgap structure of claim 1, wherein the through via passes through a center part of each of the conductive plates.

5. The electromagnetic bandgap structure of claim 1, wherein both of the two conductive layers function as one of a ground layer and a power layer, and the conductive plates are electrically connected to each other.

6. The electromagnetic bandgap structure of claim 1, wherein both of the two conductive layers function as a ground layer, and the conductive plates are electrically connected to a signal layer.

7. The electromagnetic bandgap structure of claim 1, wherein the conductive plates are placed on a same planar surface.

8. A printed circuit board comprising:
an electromagnetic bandgap structure, arranged in an area of a noise transferable path between a noise source point and a noise blocking destination point of the printed circuit board,
wherein the electromagnetic bandgap structure comprises a dielectric layer;
a plurality of conductive plates;
a stitching via, configured to pass through the dielectric layer and have a part electrically connecting the conductive plates to each other by passing through a planar surface that is different from a planar surface of the conductive plates; and
a through via,
wherein the dielectric layer, the conductive plates and the stitching via are placed between two conductive layers, and the through via is configured to pass through a clearance hole formed in each of the conductive plates and electrically connect the two conductive layers to each other, and the stitching via comprises
a first via, passing through the dielectric layer and having one end part being connected to any one of two adjacent conductive plates of the plurality of conductive plates,
a second via, passing through the dielectric layer and having one end part being connected to the other one of two adjacent conductive plates of the plurality of conductive plates, and a connection pattern, having one end part being connected to the other end part of the first via and the other end part being connected to the other end part of the second via.

9. The printed circuit board of claim 8, further comprising a different conductive layer between the two conductive layers, wherein the dielectric layer is placed between the conductive plates and the different conductive layer.

10. The printed circuit board of claim 9, wherein the different conductive layer is formed with a clearance hole, and the connection pattern is accommodated in the clearance hole formed the different conductive layer.

11. The printed circuit board of claim 8, wherein the through via passes through a center part of each of the conductive plates.

12. The printed circuit board of claim 8, wherein both of the two conductive layers function as one of a ground layer and a power layer, and the conductive plates are electrically connected to each other.

13. The printed circuit board of claim 8, wherein both of the two conductive layers function as a ground layer, and the conductive plates are electrically connected to a signal layer.

14. The printed circuit board of claim 8, wherein the conductive plates are placed on a same planar surface.

15. The printed circuit board of claim 8, wherein two electronic circuits are implemented on the printed circuit board, on the noise source point and the noise blocking destination point correspond to one position and another position, respectively, in which the two electric circuits are to be implemented.

* * * * *

UNITED STATES PATENT AND TRADEMARK OFFICE
CERTIFICATE OF CORRECTION

PATENT NO. : 8,077,000 B2
APPLICATION NO. : 12/232463
DATED : December 13, 2011
INVENTOR(S) : Ja-Bu Koo et al.

It is certified that error appears in the above-identified patent and that said Letters Patent is hereby corrected as shown below:

Column 14, Line 22, in claim 3, delete "formed" and insert -- formed in --, therefor.

Column 15, Line 12, in claim 10, delete "formed" and insert -- formed in --, therefor.

Column 16, Line 11 (Approx.), in claim 15, delete "on" and insert -- and --, therefor.

Signed and Sealed this
Sixth Day of March, 2012

David J. Kappos
*Director of the United States Patent and Trademark Office*